(12) United States Patent
Roine

(10) Patent No.: US 7,667,505 B2
(45) Date of Patent: Feb. 23, 2010

(54) QUADRATURE DIVIDE-BY-THREE FREQUENCY DIVIDER AND LOW VOLTAGE MULLER C ELEMENT

(75) Inventor: Per Torstein Roine, Oslo (NO)

(73) Assignee: Texas Instruments Norway, Oslo (NO)

( * ) Notice: Subject to any disclaimer, the term of this patent is extended or adjusted under 35 U.S.C. 154(b) by 0 days.

(21) Appl. No.: 11/575,916

(22) PCT Filed: Sep. 23, 2005

(86) PCT No.: PCT/NO2005/000354

§ 371 (c)(1),
(2), (4) Date: Jun. 24, 2008

(87) PCT Pub. No.: WO2006/033583

PCT Pub. Date: Mar. 30, 2006

(65) Prior Publication Data

US 2008/0260089 A1    Oct. 23, 2008

(30) Foreign Application Priority Data

Sep. 24, 2004    (NO)  ................................. 20044059

(51) Int. Cl.
*H03K 25/00*    (2006.01)
(52) U.S. Cl. .................. 327/115; 327/117; 327/254
(58) Field of Classification Search ................. 327/115, 327/117, 118, 199, 202, 203, 208, 215, 246, 327/247, 254, 255
See application file for complete search history.

(56) References Cited

U.S. PATENT DOCUMENTS

| 5,907,589 | A  | * | 5/1999 | Koifman et al. | ................ 377/47 |
| 6,166,571 | A  | * | 12/2000 | Wang | .......................... 327/115 |
| 6,389,095 | B1 | * | 5/2002 | Sun | ................................ 377/48 |
| 6,566,918 | B1 | * | 5/2003 | Nguyen | ...................... 327/115 |
| 6,894,551 | B2 | * | 5/2005 | Johnson | ...................... 327/258 |

* cited by examiner

*Primary Examiner*—Hai L Nguyen
(74) *Attorney, Agent, or Firm*—John J. Patti; Wade J. Brady, III; Frederick J. Telecky, Jr.

(57) ABSTRACT

A low voltage, low power, wideband quadrature divide-by-three frequency divider using a wideband low voltage, low power differential Muller C element with multiple inputs operates on quadrature input and quadrature output signals. This frequency divider can be used in frequency synthesizers and as quadrature local oscillator generator.

9 Claims, 5 Drawing Sheets

FIG. 5

| CURRENT STATE (BEFORE FIRING ENABLED TRANSITION) | | | | | ENABLED TRANSITION | NEXT STATE (AFTER FIRING ENABLED TRANSITION) | | | | |
|---|---|---|---|---|---|---|---|---|---|---|
| L_IN | Q_IN | L_OUT | Q_OUT | MARKING | | L_IN | Q_IN | L_OUT | Q_OUT | MARKING |
| 0 | 0 | 0 | 0 | {A, U} | L_IN + | 1 | 0 | 0 | 0 | {B, Q, U} |
| 1 | 0 | 0 | 0 | {B, Q, U} | L_OUT + | 1 | 0 | 1 | 0 | {C, Q, V} |
| 1 | 0 | 1 | 0 | {C, Q, V} | Q_IN + | 1 | 1 | 1 | 0 | {D, V} |
| 1 | 1 | 1 | 0 | {D, V} | L_IN - | 0 | 1 | 1 | 0 | {E, V} |
| 0 | 1 | 1 | 0 | {E, V} | Q_IN - | 0 | 0 | 1 | 0 | {F, R, V} |
| 0 | 0 | 1 | 0 | {F, R, V} | Q_OUT + | 0 | 0 | 1 | 1 | {G, R, V} |
| 0 | 0 | 1 | 1 | {G, R, V} | L_IN + | 1 | 0 | 1 | 1 | {H, W} |
| 1 | 0 | 1 | 1 | {H, W} | Q_IN + | 1 | 1 | 1 | 1 | {I, W} |
| 1 | 1 | 1 | 1 | {I, W} | L_IN - | 0 | 1 | 1 | 1 | {J, S, W} |
| 0 | 1 | 1 | 1 | {J, S, W} | L_OUT - | 0 | 1 | 0 | 1 | {K, S, X} |
| 0 | 1 | 0 | 1 | {K, S, X} | Q_IN - | 0 | 0 | 0 | 1 | {L, X} |
| 0 | 0 | 0 | 1 | {L, X} | L_IN + | 1 | 0 | 0 | 1 | {M, X} |
| 1 | 0 | 0 | 1 | {M, X} | Q_IN + | 1 | 1 | 0 | 1 | {N, T, X} |
| 1 | 1 | 0 | 1 | {N, T, X} | Q_OUT - | 1 | 1 | 0 | 0 | {O, T, U} |
| 1 | 1 | 0 | 0 | {O, T, U} | L_IN - | 0 | 1 | 0 | 0 | {P, U} |
| 0 | 1 | 0 | 0 | {P, U} | Q_IN - | 0 | 0 | 0 | 0 | {A, U} |

# QUADRATURE DIVIDE-BY-THREE FREQUENCY DIVIDER AND LOW VOLTAGE MULLER C ELEMENT

TECHNICAL FIELD

This invention relates generally to high frequency integrated circuits, and more specifically, to frequency division by a factor of three with quadrature input and quadrature output signals.

BACKGROUND

Communication devices, including those intended for wireless applications, employ a local oscillator (LO) (which generally includes a frequency synthesizer) for transmission or/and reception of radio frequency (RF) signals. For these devices, the ability to convert one single signal to different frequencies enables their compliance with regulatory requirements for different frequency bands in a cost effective manner. These frequency synthesizers are generally based on phase-locked loops (PLLs), and most frequency synthesizers based on PLLs include frequency dividers in order to compare the voltage controlled oscillator (VCO) frequency to a reference frequency in the PLL, Some examples of frequency divider are (1) a divide-by-two circuit that produces quadrature signals at half the VCO frequency and (2) a selectable frequency divider for covering several frequency bands using the same frequency synthesizer. However, to efficiently cover the largest number of different frequency bands using a minimum of signal sources, it can be necessary to reduce the frequency of an available signal by an odd factor of three.

Additionally, in communication devices, quadrature representation is used for complex signals, which discern between positive and negative frequencies. The quadrature signals have a relative phase difference of 90 degrees (commonly referred to as in-phase "I" and quadrature "Q" signals). Usually, the "I" signal component leads the "Q" signal component by 90 degrees for positive frequencies. The quadrature representation is typically used for the LO signal in frequency converters to achieve image rejection, in zero-IF circuitries and single-sideband generation, to distinguish between positive and negative frequency signal components. Signals of quadrature phases are for example required for the implementation of I/Q-up conversion (quadrature modulators in transmitters) and I/Q-down conversion (demodulators and image-rejection mixers in zero-IF, low-IF or super-heterodyne receivers). Quadrature LO signal generators can therefore important building blocks in communication devices incorporating I/Q frequency conversion.

Conventional divide-by-three frequency dividers typically consists of a chain master-slave D-type flip-flops connected in cascade, operating from a common clock signal, with a final signal being generated at a frequency which is equal to the clock, signal frequency divided by three. Other divide-by-three frequency dividers require combinational logic between each flip-flop stage that is difficult to implement in high frequency applications due to the voltage headroom constraints and bandwidth limitations that can limit performance of the device. Many conventional divide-by-three circuits, however, are not capable of providing output signals with 50% duty cycle that can be critical for spurious response, timing, and noise performance. Additionally, frequency division by a factor of three of quadrature signals using existing techniques results in twice or nearly twice the complexity and power consumption of a single divide-by-three circuit.

Some examples of conventional circuits are: U.S. Pat. No. 4,617,475; U.S. Pat. No. 5,838,166; and U.S. Pat. No. 6,389,095.

SUMMARY

A general method for synthesis of divide-by-three frequency division operating on quadrature inputs and quadrature outputs is disclosed together with a design of a low voltage low power wideband differential Muller C-element. Further, quadrature divide-by-three frequency divider circuits using SR-latches or Muller C-elements, including the Muller C-element of the present invention, are disclosed.

The disclosed divide-by-three implementations provide high-performance and cost optimal solutions to the task of dividing an available quadrature signal by an odd factor of three.

The disclosed differential Muller C-element can be used in low-voltage applications, consumes little power and is capable of high frequency operation.

Further, the disclosed quadrature divide-by-three divider circuit using Muller C-elements with three inputs according to the invention requires a minimum number of devices and thus promotes reliability, ease of implementation and low cost.

The present invention is achieved by means of the features as set forth in the appended set of claims, and is believed to obviate or mitigate at least one disadvantage of previous' Muller C-elements and quadrature divide-by-three frequency dividers in terms of cost effectiveness or/and low voltage and high frequency operation.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 shows a table depicting STG states, markings, and enabled transitions of a quadrature divide-by-three circuit;

DETAILED DESCRIPTION

Figure 1:
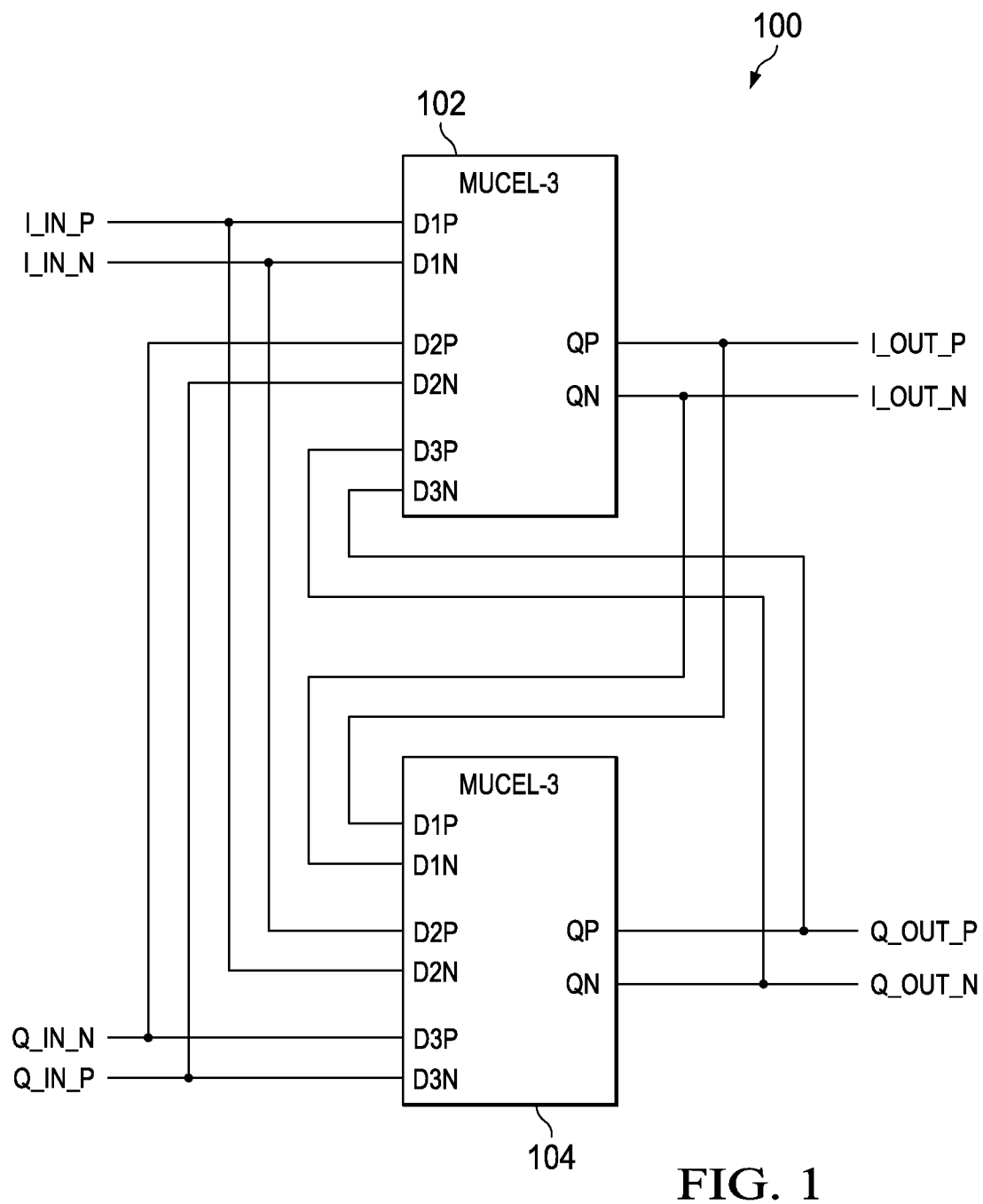
FIG. 1 shows a quadrature divide-by-three circuit implemented with two Muller C-elements in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, reference numeral 100 generally designates a divide-by-three circuit that employs Muller C-element in accordance with a preferred embodiment of the present invention. Preferably, circuit 100 comprises two Muller C-elements coupled to one another that receive the differential in-phase (I_IN_P and I_IN_N) and quadrature (Q_IN_P and Q_IN_M) components of an input signal to generate the divided-by-three differential in-phase (I_OUT_P and I_OUT_N) and quadrature (Q_OUT_P and Q_OUT_N) output signal. Preferably, each of Muller C-elements 102 and 104 receives the differential in-phase (I_IN_P and I_IN_N) and quadrature (Q_IN_P and Q_IN_N) components of the input signal (as well as the output from the other Muller C-elements 102 and 104) to generate the divided-by-three differential in-phase (I_OUT_P and I_OUT_N) and quadrature (Q_OUT_P and Q_OUT_N) output signal.

The Muller C-element is one of the basic building blocks of asynchronous circuits. In operation, when all inputs are in the same state, the Muller C-element switches state to the same state as the inputs. It will then maintain this state, until all inputs have switched to the other state.

In general, a Muller C-element with N inputs can be implemented using a majority gate with 2N–1 inputs, where N–1 of the inputs are connected to the output. Alternatively, this can be seen as a majority gate with N input of weight 1 and one input (connected to the output) of weight N–1. The majority gate can be implemented with threshold logic, where the outputs are connected together in parallel. The output from a threshold logic gate with N inputs is given by the equation:

$$q = \text{sgn}\left(\sum_{i=1}^{N} w_i d_i\right) \quad (1)$$

where $q=-1$ signifies that the output Q is binary '0', and $q=1$ signifies that the Output Q is binary '1'. Similarly, $d_i=-1$ signifies that the input $D_i$ is binary '0', and $d_i=1$ signifies that the input $D_i$ is binary '1'. The value $w_i$, gives the weight of input $D_i$.

In robust designs, differential signals with low voltage swing are often used to achieve high speed and good noise performance with relatively low energy consumption. High-speed frequency dividers are usually implemented in differential current steering logic, such as emitter-coupled logic with Bipolar Junction Transistors (BJT's) or source-coupled logic with Metal Oxide Semiconductor Field Effect Transistors (MOSFET's).

A high-speed threshold logic gate with N inputs using low voltage swing differential signals can be implemented using N differential pairs, each connected to one differential input and a tail current source/sink, and with the differential outputs (drains or collectors) connected to each other in parallel. The differential pairs should also be saturated by the input voltage swing, so that the whole tail current is effectively steered to one of the two differential outputs. Two loads pull up/down the differential outputs towards the positive/negative (ground) supply voltage. The current summation caused by the parallel connection of the differential pairs implements the summation operation in the equation above. The input weight $w_i$ is implemented by scaling the current from each current source/sink relative to the other current sources/sinks. For good device matching, the sizes of the input transistors can also by sized by the weight $w_i$. The differential output voltage takes on many values, proportional to the signed sum of the inputs. The sign operator sgn in the equation above is handled by decision operation of the succeeding circuitry, for instance by differential pair(s) with inputs connected to the outputs of the N-input threshold logic gate.

Figure 2:
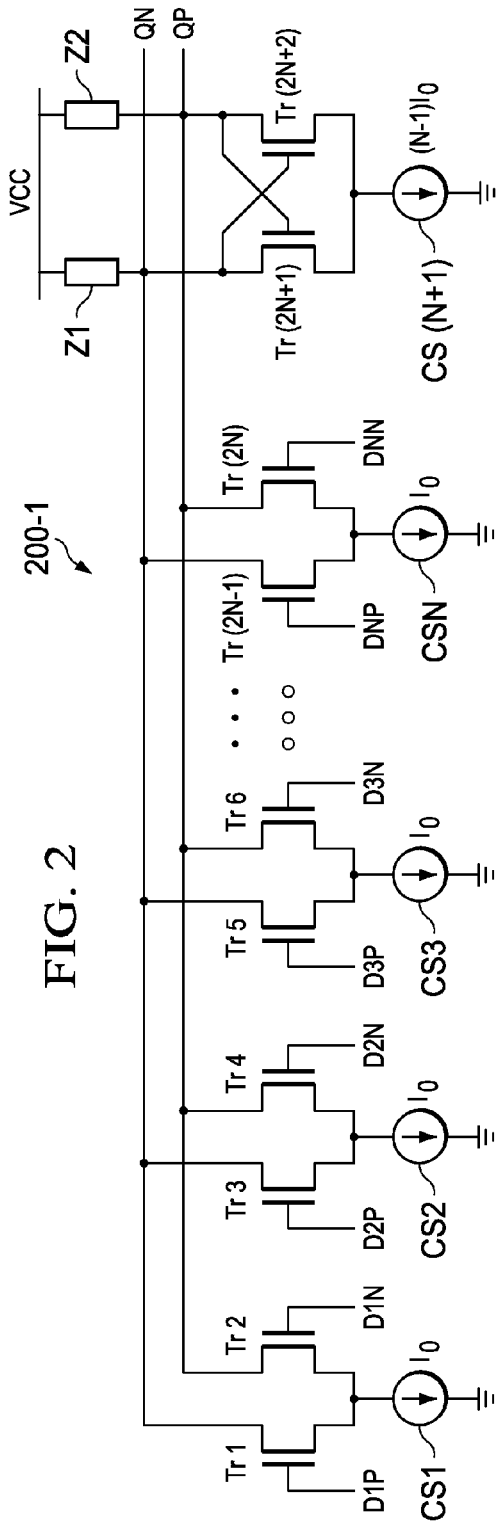
FIGS. 2 and 3 show examples of an N-input Muller C-element implemented in differential current steering threshold logic with in accordance with a preferred embodiment of the present invention.
Figure 3:
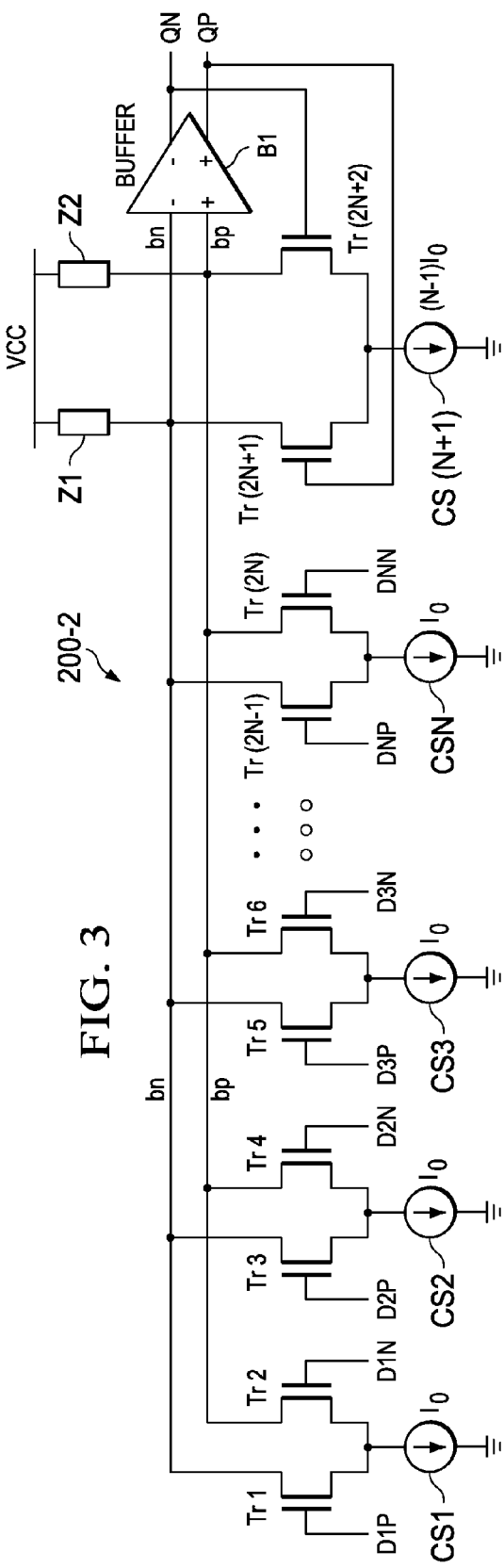

Turning to FIGS. 2 and 3, Muller-C elements 200-1 and 200-2 can be seen, which may be used as Muller C-elements 102 and 104 in FIG. 1 for N=3. In particular, Muller C-element 200-1 is a Muller C-element with N inputs implemented as a differential current steering threshold logic gate using MOSFETs, which generally comprise differential input MOS transistor pairs Tr1/Tr2 to Tr(2N–1)/Tr(2N), a pair of cross-coupled MOS transistors Tr(2N+1)/Tr(2N+2), current sources CS1 to CS(N+1), and impedance elements Z1 and Z2. The first N inputs to the differential input pairs Tr1/Tr2 to Tr(2N–1)/Tr(2N), which make up the inputs to the Muller C-element, all have weight w=1. The last input has a weight of N–1 and is connected locally inside the Muller C-element to the outputs nodes QP, QN, causing the output to maintain the last binary value until all the N inputs switch to the opposite binary value. Additionally, each current source CS1 to CS(N) source or sinks about the same current of $I_0$, while current source CS(N+1) is a current of $(N-1)I_0$. Moreover, for improved noise margins, at the expense of energy consumption and operating speed, a local buffer 202 with voltage gain can be connected between the internal summing nodes and the outputs.

For an example (as can be used with circuit 100) wherein N=3, each the transistors Tr(2N+1)/Tr(2N+2) (or Tr7 and Tr8) can be implemented as two transistors in parallel, each having the same physical dimensions as each of the transistors Tr1 to T(2N) (or Tr6). The outputs QP, QN are connected to two load impedances Z1 and Z2, which pull the output up towards the positive supply voltage on rail VCC. The load impedances can be implemented as passive devices (e.g. polysilicon resistors), or as active devices (e.g. PMOS transistors operating in the linear region).

For all examples of MOSFET implementations of Muller C-elements implemented as a differential current steering threshold logic gate in FIGS. 2 and 3, a complementary coupling can also be used, i.e. using PMOS instead of NMOS, and load impedances connected towards ground or negative supply voltage instead of positive supply voltage.

As described above, frequency division at non-power-of-two ratios is not trivial to achieve. A division circuit with 50% duty cycle has the same number of input phases between each of the output phase transitions. In order to maintain the 90 degrees phase difference between the in-phase I and quadrature Q components, a division circuit with quadrature outputs has the same number of input phases between each of the four output phase transitions in a cycle. Therefore, the number of input transitions in an output cycle is a multiple of four with quadrature outputs. For example, this is achieved in a divide-by-two circuit without quadrature inputs (two input phases for each input period), since there are (2×2=4) input phases for each output period. For a divide-by-three circuit without quadrature inputs there are (2×3=6) input phases for each output period. Since this is riot a multiple of four, such a circuit cannot be made with quadrature outputs. A divide-by-three circuit with quadrature inputs however, has (4×3=12) input phases for each output period. This can be implemented with three input phases between each output phase transition. This will be further described with reference to FIG. 6.

An asynchronous implementation of the divide-by-three circuit can be found by analyzing the specification in form of a Signal Transition Graph (STG). This is a form of Petri-Net specially developed for asynchronous circuit synthesis.

As other Petri-Nets, Signal Transition Graphs (STGs) consist of a set of places, a set of transitions, and a marking, which is a set of places that are currently holding tokens. There is also a mapping (arrows) from transitions to places and from places to transitions. Places in an STG can contain either zero or one token. In an STG, places with only one predecessor and one successor transition (one input arrow and one output arrow) are not drawn. Instead, arrows are drawn directly from one transition to another. Such an arrow contains an implicit place. When the implicit place contains a token (i.e. is part of the marking), the token is drawn directly on the arrow.

Transitions in an STG correspond to changes in binary signals in the circuit (inputs, outputs or internal signals). For a signal named $X_5 X+$ means that X goes from '0' (LOW logic level) to '1' (HIGH logic level), while X− means that X goes from '1' to '0'. A transition with tokens on every input place (each arrow leading to the transition) is said to be enabled, and can fire at any time. Firing a transition corresponds to a change of the binary signal associated with the transition. If multiple signals are enabled at the same time, they can fire in any order. When firing a transition, tokens are removed from all the transition's input places (arrows leading to the transition) and inserted on all the transition's output places (arrows leading from the transition).

Figure 4:
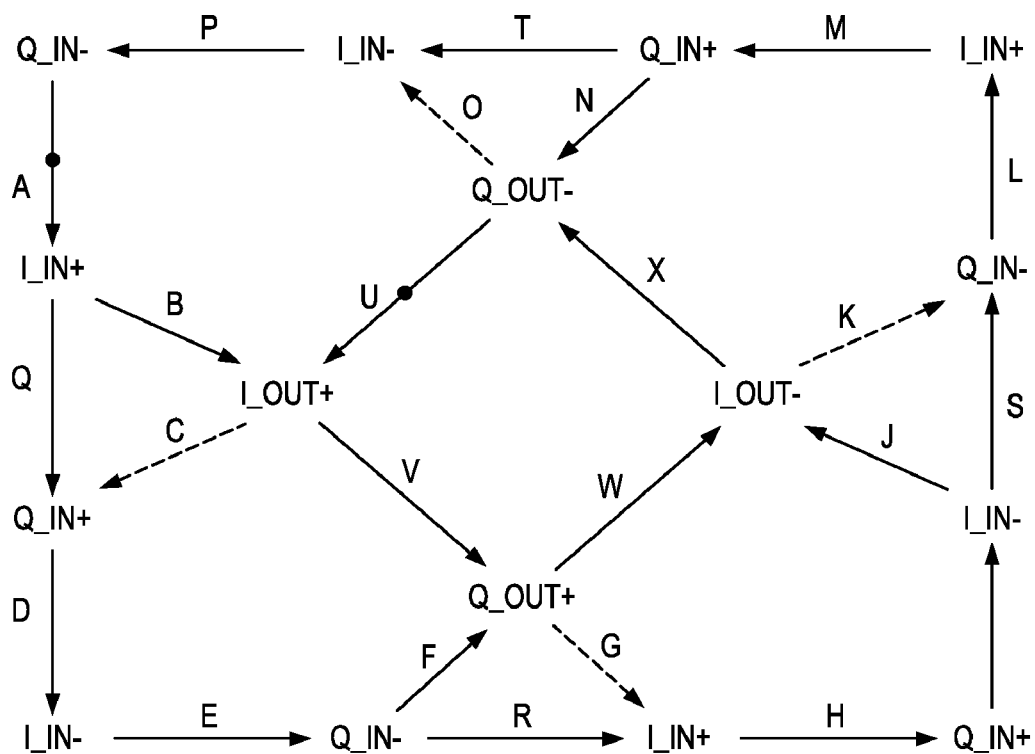
FIG. 4 shows the Signal Transition Graph (STG) of a quadrature divide-by-three circuit.
Figure 6:
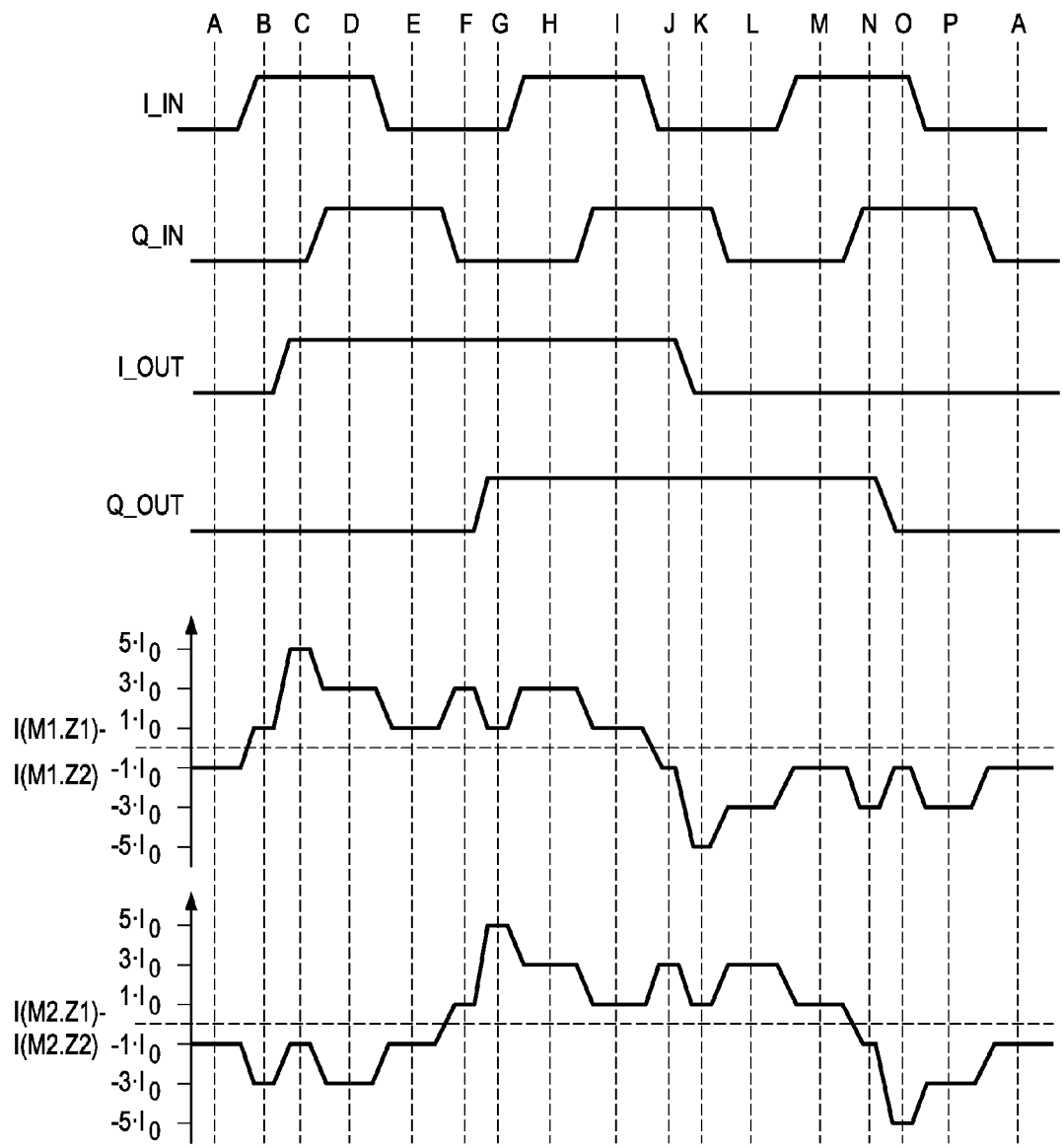
FIG. 6 shows timing diagram of a quadrature divide-by-three circuit together with the load resistor currents of the two three-input differential current steering Muller C-elements in FIG. 1

FIGS. 4 to 6 represent different presentations for the possible states of the quadrature divide-by-three circuit, and these will now be further explained.

FIG. 4 shows a Signal Transition Graph (STG) for the divide-by-three circuit. All places are of the implicit type, associated with the arrows going from one transition to another. There are 24 arrows, and hence implicit places, denoted with the letters A through X. The arrows marked A through P are used to describe the circuit. The other arrows are redundant because they are given by sequences of other arrows. For example, arrow Q is redundant because the sequence of the arrows B and C implies the transition ordering given by arrow Q. Without considering input-output interaction, the redundant arrows, however, completes the ordering of the input transitions (arrows Q-T) and the output transitions (arrows U-X).

The initial marking {A, U} in FIG. 4 corresponds to state A in the timing diagram in FIG. 6. As the STG shows, the only enabled transition is I_IN+. After this transition fires, the marking becomes {B, Q, U}. Now, I_OUT+ is the only enabled transition. FIG. 10 lists all the reachable states in sequence, with corresponding markings and enabled transitions. Note that exactly one transition is enabled in every state. This means that in each state, exactly one of the arrows A-P in FIG. 4 is contained in the marking. In the timing, diagram of FIG. 6, the state labels A-P also correspond to which of the arrows A-P that is marked in the Signal Transition Graph in FIG. 4.

The stippled arrows (C, G, K and O) in FIG. 4 imply a timing relation (or feedback) between the outputs of the circuit and the inputs. They are used to avoid concurrently enabled transitions, which would increase the number of states and state holding signals. For a frequency divider, these arrows simply define a timing relation that limits the maximum division frequency. In practice, the frequency divider may be further optimized in the analog domain for increased operation frequency or reduced energy consumption. Although the resulting circuit correctly divides by three, it may not necessarily adhere strictly to the output-input timing relation defined by the stippled arrows.

In order to find an asynchronous state machine implementation of the circuit, the state of the other signals can be analyzed for each output transition. From FIG. 5, we find that the I_OUT+ transition is enabled when I_IN='1', Q_IN='0' and Q_OUT='0', and the I_OUT− transition is enabled when I_IN='0', Q_IN='1' and Q_OUT='1'. This means that the I_OUT signal can be implemented with an asynchronous S/R-latch with $S = I\_IN \cdot \overline{Q\_IN} \cdot \overline{Q\_OUT}$, and (2)

$R = \overline{I\_IN} \cdot Q\_IN \cdot Q\_OUT.$ (3)

Similarly, the Q_OUT signal can be implemented with an asynchronous S/R-latch with $S = \overline{I\_IN} \cdot \overline{Q\_IN} \cdot Q\_OUT$, and (4)

$R = I\_IN \cdot Q\_IN \cdot \overline{Q\_OUT}.$ (5)

As mentioned above, FIG. 6 shows the timing diagram of a quadrature divide-by-three circuit together with the load resistor currents of the two three-input differential current steering Muller C-element according to a preferred embodiment of the present invention (elements 102 and 104 in FIG. 1). The letters A through P denotes the 16 different states. Seen from a divider implementation, there are four transitional states (B, F, J and N) in addition to the 12 input phases. In the transitional states, a change of the divider outputs will occur. One interesting property is that each of the 16 states corresponds to a unique combination of the four binary input/output signals I_IN, Q_IN, I_OUT and Q_OUT. This is used in order to implement the circuit as an asynchronous state machine without additional state holding elements. Since the number of states is the same as the number of possible combinations of the four binary signals, all combinations are part of the sequence. Therefore, no reset/initialization circuitry is needed, because a correct implementation will always follow the correct sequence regardless of the start-up conditions.

The transient operation of the divide-by-three circuit using differential current steering threshold logic, as shown in FIGS. 2 and 3, is explained below in connection with FIG. 6. Starting at the state "A" in FIG. 6 (first line of FIG. 5), the signal values, are I_IN='0', Q_IN='0', I_OUT='0' and Q_OUT='0'. In the Muller C-element 102 of FIGS. 2 and 3, the differential pair connected to I_IN steers its tail current Io into the load impedance Z2 connected to the signal I_OUT_P when I_IN='0'. In the same Muller C-element, the differential pair connected to Q_IN steers its tail current $I_0$ into the load impedance Z1 connected to the signal I_OUT_N when Q_IN='0'. Likewise, the differential pair connected to Q_OUT steers its tail current $I_0$ into the load impedance Z1 connected to the signal I_OUT_N when Q_IN='0'. Finally, the local feedback steers its tail current $2 \times I_0$ into the load impedance Z2 connected to the signal I_OUT_P when Q_IN='0'. Thus, in the Muller C-element 102, the sum of the current in the load impedance Z1 (connected to I_OUT_N) is 2×lo, while the sum of the current in the load impedance Z2 (connected to I_OUT_P) is $3 \times I_o$. This gives V(I_OUT_P)<V(I_OUT_N), which in differential logic is interpreted as I_OUT='0'. In the same way, it can be shown that in the Muller C-element M2, the sum of the current in the load impedance Z1 (connected to Q_OUT_P) is $2 \times I_0$, while the sum of the current in the load impedance Z2 (connected to Q_OUT_P) is $3 \times I_0$. This gives V(Q_OUT_P)<V(Q_OUT_N), which in differential logic is interpreted as Q_OUT='0'. Thus, in state A, the circuit is stable, awaiting input changes.

A low-to-high transition on the input I_IN causes the circuit to change from state A to state B. The differential pair connected to I_IN in the Muller C-element 102 now steers its tail current $I_0$ to flow through the load impedance Z1 connected to I_OUT_N instead of the load impedance Z2 connected to I_OUT_P. The net effect is that the sum of the current in the load impedance Z1 (connected to I_OUT_N) is $3 \times I_0$, while the sum of the current in the load impedance Z2 (connected to I_OUT_P) is $2 \times I_0$. This gives V(I_OUT_P)>V(I_OUT_N), which in differential logic is interpreted as I_OUT='1'. At the same time, the differential pair connected to I_IN in the Muller C-element M2 now steers its tail current $I_0$ to flow through the load impedance Z2 connected to Q_OUT_P instead of the load impedance Z1 connected to Q_OUT_N. Here, the net effect is that the sum of the current in the load impedance Z1 (connected to Q_OUT_N) is $1 \times I_0$, while the sum of the current in the load impedance Z2 (connected to Q_OUT_P) is $4 \times I_0$. This gives V(Q_OUT_P)<V(Q_OUT_N), which in differential logic is interpreted as Q_OUT='0'.

The circuit is not stable in state B, as the output I_OUT goes to '1' (while Q_OUT remains at '0'). The low-to-high transition of I_OUT switches the local feedback differential pair in the Muller C-element 102 to steer its tail current $2 \times I_0$ through the load impedance Z1 connected to I_OUT_N instead of the load impedance Z2 connected to I_OUT_P. The net effect is that the sum of the current in the load impedance Z1 (connected to I_OUT_N) is $5 \times I_0$, while the sum of the current in the load impedance Z2 (connected to I_OUT_P) is 0. This gives V(I_OUT_P)>V(I_OUT_N), which in differential logic is interpreted as I_OUT='1'. At the same time, the differential pair connected to I_OUT in the Muller C-element 102 now steers its tail current $_0$ to flow through the load impedance Z1 connected to Q_OUT_N instead of the load impedance Z2 connected to Q_OUT_P. Here, the net effect is that the sum of the current in the load impedance Z1 (connected to Q_OUT_N) is $2 \times I_0$, while the sum of the current in the load impedance Z2 (connected to Q_OUT_P) is $3 \times I_0$. This gives V(Q_OUT_P)<V(Q_OUT_N), which in differential logic is interpreted as Q_OUT='0'. After this, the circuit is stable in state C, awaiting further input changes.

Each of the states A-P in the timing diagram of FIG. 11 can be analysed the ■same way. In FIG. 11, the timing diagram is also appended by the difference between the currents flowing in the loads Z1 and Z2 of each of the two three-input differential current steering Muller C-elements 102 and 104 in FIG. 1. If linear loads are used, the differential output signals I_OUT and Q_OUT will be proportional to the current differences at the outputs. It can be seen that the I_OUT and Q_OUT output voltages has six stable differential values (three positive and three negative). The output signal transitions will be smoother when operating close to the maximum divider speed because the rise and fall times become a non-negligible portion of the cycle time.

The logical operation of an asynchronous divide-by-three circuit as detailed above is characterized by the following relationships of the input and output signals:

$$I\_OUT = \text{sgn}(I\_IN + \overline{Q\_IN} + \overline{Q\_OUT} + 2 \cdot I\_OUT) \quad (6)$$

$$Q\_OUT = \text{sgn}(\overline{I\_IN} + \overline{Q\_IN} + Q\_OUT + 2 \cdot I\_OUT) \quad (7)$$

where each of the signal variables I_IN, Q_IN, I_OUT, Q_OUT, and their corresponding inverted variables $\overline{I\_IN}$, $\overline{Q\_IN}$, $\overline{I\_OUT}$, $\overline{O\_OUT}$ in the equations (6) and (7) can take one of two numeric values, −1 and 1, at any time, with −1 as the equivalent of binary logic LOW or '0', and 1 as the equivalent of binary logic HIGH or '1'. The appearance of the output signal variables on both sides of the equations implies that the asynchronous operation includes feedback from the outputs to the inputs.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a voltage rail;
   a first Muller C-element having:
   a first set of differential input transistor pairs, wherein at least one of the differential input transistors from the first set of differential input transistor pairs receives an in-phase component of an input signal, and wherein at least one of the differential input transistors from the first set of differential input transistor pairs receives a quadrature component of the input signal;
   a first impedance element that is coupled between the voltage rail and at least one transistor from each differential input transistor pair from the first set of differential input transistor pairs;
   a second impedance element that is coupled between the voltage rail and at least one transistor from each differential input transistor pair from the first set of differential input transistor pairs; and
   a first pair of cross-coupled transistors, wherein each transistor from the first pair of cross-coupled transistors is coupled to at least one of the first and second impedance elements; and
   a second Muller C-element having:
   a second set of differential input transistor pairs, wherein at least one of the differential input transistors from the second set of differential input transistor pairs receives the in-phase component of the input signal, and wherein at least one of the differential input transistors from the second set of differential input transistor pairs receives the quadrature component of the input signal, and wherein each differential input transistor pair from the first set of differential input transistor pairs is coupled to at least one of the differential input transistor pairs from the second set of differential input transistor pairs, and wherein each differential input transistor pair from the second set of differential input transistor pairs is coupled to at least one of the differential input transistor pairs from the first set of differential input transistor pairs;
   a third impedance element that is coupled between the voltage rail and at least one transistor from each differential input transistor pair from the second set of differential input transistor pairs;
   a fourth impedance element that is coupled between the voltage rail and at least one transistor from each differential input transistor pair from the second set of differential input transistor pairs; and
   a second pair of cross-coupled transistors, wherein each transistor from the second pair of cross-coupled transistors is coupled to at least one of the third and fourth impedance elements.

2. The apparatus of claim 1, wherein the first Muller C-element further comprises a buffer that is coupled to each differential input transistor pair from the first set of differential input transistor pairs.

3. The apparatus of claim 1, wherein the second Muller C-element further comprises a buffer that is coupled to each differential input transistor pair from the second set of differential input transistor pairs.

4. An apparatus comprising:
a voltage rail;
a first Muller C-element having:
   a first output node;
   a second output node;
   a first differential input MOS transistor pair, wherein each MOS transistor from the first differential input MOS transistor pair receives an in-phase component of an input signal at its gate, and wherein each MOS transistor from the first differential input MOS transistor pair is coupled to one of the first and second output nodes;
   a first current source that is coupled the first differential input MOS transistor pair;
   a second differential input MOS transistor pair, wherein each MOS transistor from the second input differential MOS transistor pair receives a quadrature component of the input signal at its gate, and wherein each MOS transistor from the second differential input MOS transistor pair is coupled to one of the first and second output nodes;
   a second current source that is coupled the second differential input MOS transistor pair;
   a third differential input MOS transistor pair, wherein each MOS transistor from the third differential input MOS transistor pair is coupled to one of the first and second output nodes;
   a third current source that is coupled the third differential input MOS transistor pair;
   a first impedance element that is coupled between the voltage rail and the first output node;
   a second impedance element that is coupled between the voltage rail and the second output node;
   a first pair of cross-coupled MOS transistors, wherein each MOS transistor from the first pair of cross-coupled MOS transistors is coupled to at least one of the first and second output nodes; and
   a fourth current source that is coupled to the first pair of cross-coupled MOS transistors;
a second Muller C-element having:
   a third output node that is coupled to the gate of at least one of MOS transistors from the third differential input MOS transistor pair;
   a fourth output node that is coupled to the gate of at least one of MOS transistors from the third differential input MOS transistor pair;
   a fourth differential input MOS transistor pair, wherein each MOS transistor from the fourth differential input MOS transistor pair receives the in-phase component of the input signal at its gate, and wherein each MOS transistor from the fifth differential input MOS transistor pair is coupled to one of the third and fourth output nodes;
   a fifth current source that is coupled the fourth differential input MOS transistor pair;
   a fifth differential input MOS transistor pair, wherein each MOS transistor from the fifth differential MOS transistor pair receives a quadrature component of the input signal at its gate, and wherein each MOS transistor from the fifth differential input MOS transistor pair is coupled to one of the third and fourth output nodes;
   a sixth current source that is coupled the fifth differential input MOS transistor pair;
   a sixth differential input MOS transistor pair, wherein each MOS transistor from the sixth differential input MOS transistor pair is coupled to one of the first and second output nodes and one of the third and fourth output nodes;
   a seventh current source that is coupled the sixth differential input MOS transistor pair;
   a third impedance element that is coupled between the voltage rail and the third output node;
   a fourth impedance element that is coupled between the voltage rail and the fourth output node;
   a second pair of cross-coupled MOS transistors, wherein each MOS transistor from the second pair of cross-coupled MOS transistors is coupled to at least one of the third and fourth output nodes; and
   an eighth current source that is coupled to the second pair of cross-coupled MOS transistors.

5. An apparatus comprising:
a first Muller C-element having a plurality of differential input terminal pairs and a differential output terminal pair, wherein at least one of the differential input terminal pairs of the first Muller C-element receives an in-phase component of an input signal, and wherein at least one of the differential input terminal pairs of the first Muller C-element receives a quadrature component of the input signal; and
a second Muller C-element having a plurality of differential input terminal pairs and a differential output terminal pair, wherein at least one of the differential input terminal pairs of the second Muller C-element receives the in-phase component of the input signal, and wherein at least one of the differential input terminal pairs of the second Muller C-element receives the quadrature component of the input signal, and wherein the differential output terminal pair of the first Muller C-element are coupled to at least one of the differential input terminal pairs of the second Muller C-element, and wherein the differential output terminal pair of the second Muller C-element are coupled to at least one of a differential input terminal pairs of a third Muller C-element.

6. The apparatus of claim 5, wherein the first Muller C-element further comprises:
a voltage rail;
a plurality of differential input transistor pairs;
a first impedance element that is coupled between the voltage rail at least one transistor from each of the plurality of differential input transistor pairs;
a second impedance element that is coupled between the voltage rail at least one transistor from each of the plurality of differential input transistor pairs; and
a pair of cross-coupled transistors, wherein each transistor from the pair of cross-coupled transistors is coupled to at least one of the first and second impedance elements.

7. The apparatus of claim 6, wherein the first Muller C-element further comprises a buffer that is coupled to each of the differential input transistor pairs.

8. The apparatus of claim 5, wherein the second Muller C-element further comprises:
- a voltage rail;
- a plurality of differential input transistor pairs;
- a first impedance element that is coupled between the voltage rail at least one transistor from each of the plurality of differential input transistor pairs;
- a second impedance element that is coupled between the voltage rail at least one transistor from each of the plurality of differential input transistor pairs; and
- a pair of cross-coupled transistors, wherein each transistor from the pair of cross-coupled transistors is coupled to at least one of the first and second impedance elements.

9. The apparatus of claim 8, wherein the second Muller C-element further comprises a buffer that is coupled to each of the differential input transistor pairs.

* * * * *